United States Patent [19]

Kawasaki

[11] Patent Number: 4,750,061
[45] Date of Patent: Jun. 7, 1988

[54] AMPLITUDE LIMITER CIRCUIT
[75] Inventor: Somei Kawasaki, Tokyo, Japan
[73] Assignee: Canon Kabushiki Kaisha, Tokyo, Japan
[21] Appl. No.: 890,062
[22] Filed: Jul. 24, 1986
[30] Foreign Application Priority Data
 Jul. 27, 1985 [JP] Japan ................. 60-166306
[51] Int. Cl.⁴ .......................... G11B 5/024; G11B 5/03
[52] U.S. Cl. ...................................... 360/66; 307/549; 307/567
[58] Field of Search .............. 360/66; 307/240, 243, 307/255, 228, 513, 549, 567, 559; 328/181
[56] References Cited
U.S. PATENT DOCUMENTS
 3,666,893 5/1972 Fujiwara et al. ................ 360/66

Primary Examiner—Raymond F. Cardillo
Assistant Examiner—Kevin J. Fournier
Attorney, Agent, or Firm—Robin, Blecker & Daley

[57] ABSTRACT

An amplitude limiter circuit including first and second semiconductor elements of different conductivity types having their emitters connected with each other, first and second impedance elements connected to bases of said first and second semiconductor elements, respectivly, a switch and a capacitor connecting said first and second impedance elements, a third impedance element through which continuous oscillation is fed to the emitters of said first and second semiconductor elements, and means for applying control signal to said switch to operate said switch, thereby producing damped oscillation signal which finally reduces to zero.

13 Claims, 3 Drawing Sheets

AMPLITUDE LIMITER CIRCUIT

BACKGROUND OF THE INVENTION

1. Field of the Invention

The present invention relates to an amplitude limiter circuit for generating a signal including continuous oscillation and gradually damping oscillation following said continuous oscillation, for use as an erasing signal or the like in a magnetic recording and/or reproducing apparatus and, particularly, it relates to means for enabling reducing the damped oscillation finally to zero.

2. Description of the Related Art

In a magnetic recording and/or reproducing apparatus for recording video signals at a period of one field or one frame onto a recording medium, such as a magnetic disc, in case where a recording track 2 is formed concentrically on a magnetic disc 1 as shown in FIG. 2, for example, it is desirable that each track as formed on the disc can be independently erased. In such case, it is preferably to use an erasing signal including continuous oscillation T2 having a frequency out of the the frequency range of a video signal to be recorded and gradually damped oscillation T3 following said continuous oscillation (see FIG. 3A) since such an earsing signal enables a magnetic head to operate within a high permeability range, so that each recording track as recorded on the recording medium can be erased in an efficient manner (see Japanese Laid-Open Patent Application No. Sho 84-110008).

Heretofore, a circuit as shown in FIG. 4, for example, has been used to generate a signal including continuous oscillation and damped oscillation following said continuous oscillation. The circuit as shown in FIG. 4 includes an oscillator 3 for generating continuous oscillation as shown in FIG. 3B, an amplitude modulator 4, a trapezoidal wave generating circuit 5, and a control circuit 7. The trapezoidal wave generating circuit receives a pulse as shown in FIG. 3C from the control circuit 7 and generates a trapezoidal wave as shown in FIG. 3D. The amplitude modulator 4 effects amplitude modulation of the continuous oscillation fed from the oscillator 3 by the trapezoidal wave fed from the trapezoidal wave generating circuit 5 and feeds the modulated signal to an output terminal 9. The output signal at the terminal 9 is passed through a filter 10, which removes unnecessary higher harmonic waves, and is then subjected to linear amplification by an amplifier 11. The amplified signal is recorded by a magnetic head 12 onto the recording medium 1, as an erasing signal, to erase a video signal thus far recorded on the recording medium. For example, during the continuous oscialltion period T2 as shown in FIG. 3A, the magnetization in the recording medium 1 is subjected to saturated magnetization by the erasing signal, so that the original signal previously recorded on the recording medium is erased by the superimposed erasing signal, and then distortion is removed during the damped oscillation period T3. The periods T2 and T3 are so determined that the above conditions are satisfied.

However, the conventional device as shown in FIG. 4 has a drawback as described below. That is, this device requires delicate adjustment of the potential of the trapezoidal wave fed to the amplitude modulator 4, and if this potential is subjected to a drift owing to temperature change, a carrier (continuous oscillation) having amplitude shown by a in FIG. 5 would remain in the erasing signal and it might be impossible to make efficient erasing oscillation.

SUMMARY OF THE INVENTION

It is an object of the present invention to eliminate the drawback as mentioned above in the conventional amplitude limiter circuit and to provide an amplitude limiter circuit for generating a signal including continuous oscillation and damped oscillation following said continuous oscillation in which means is provided to reduce the damped oscillation finally to zero.

In order to attain the above object, the present invention provides an amplitude limiter circuit including first and second semiconductor elements of different conductivity types having their emitters connected with each other, first and second impedance elements connected to bases of said first and second semiconductor elements, respectively, a switch and a capacitor connecting said first and second impedance elements, a third impedance element through which continuous oscillation is fed to the emitters of said first and second semiconductor elements, and means for applying a control signal to said switch to operate said switch.

In the construction as described above, when said control signal is at low level, the continuous oscillation does not appear at an output terminal of said circuit. When said control signal becomes at the high level the bases of said first and second semiconductor elements are short-circuited by said switch, said continuous oscillation appears at the output terminal of said circuit. Then, when the said control signal becomes at low level again, said switch is turned off again. In this case, however, the base potentials of said first and second semiconductor elements do not immediately return to the predetermined potentials equal to those at the time when the control signal was not at low level, under the action of said first and second impedance elements and said capacitor, and they gradually rise or fall. During the gradual changes of the base potentials, a signal having gradually decreasing amplitude appears at the output terminal of the circuit. At the time when they reached said predetermined potentials, the signal appearing at the output terminal of the circuit becomes substantially zero. Accordingly, the construction as described above provides a signal including continuous oscillation and the following damped oscillation having amplitude which is gradually decreased and finally reduced to substantially zero.

BRIEF DESCRIPTION OF THE DRAWINGS

FIGS. 3A, 3B, 3C and 3D are wave-form diagrams which explain the operation of the circuit according to the embodiment shown in FIG. 1, in which:

FIG. 3A is a wave-form diagram of an output erasing signal;

FIG. 3B is a wave-form diagram showing continuous oscillation;

FIG. 3C is a wave-form diagram showing a control signal; and

FIG. 3D is a wave-form diagram showing a trapezoidal wave signal.

DETAILED DESCRIPTION OF THE PREFERRED EMBODIMENT

Now, the construction and the function of the preferred embodiment of the present inveniton will be described, with reference to FIGS. 1, 3A-3D and 6. (Construction of the embodiment of the amplitude limiter circuit according to the present invention) (FIGS. 1 and 3A-3D).

Figure 1:
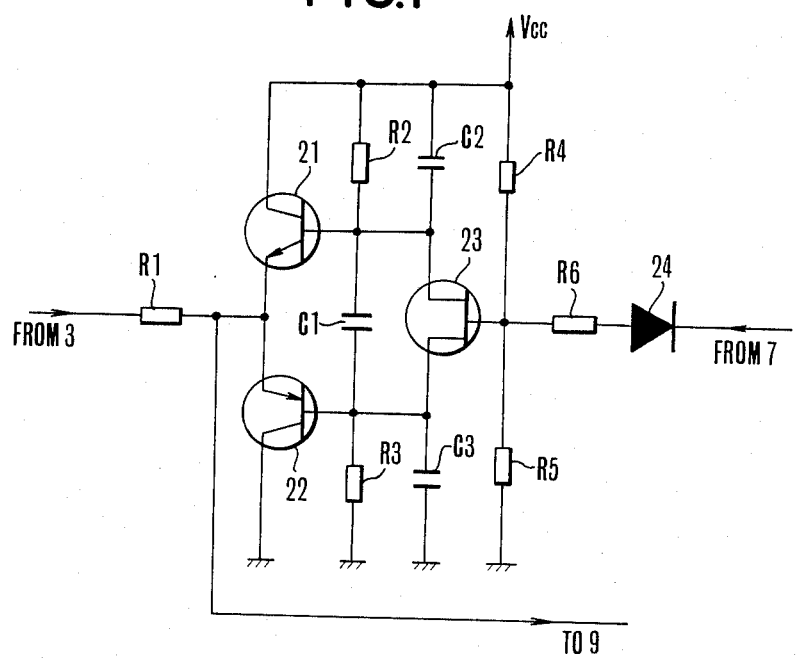
FIG. 1 is a circuit diagram showing an embodiment of the amplitude limiter circuit according to the present invention.
Figure 2:
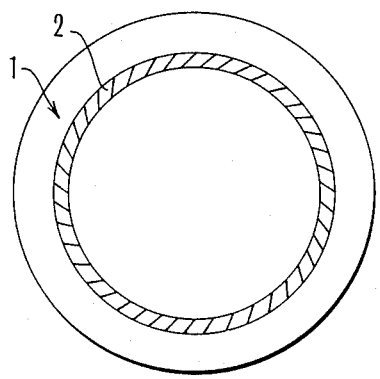
FIG. 2 is a diagram illustrating a recording track on a magnetic disc in a magnetic recording and/or reproducing apparatus.
Figure 3:
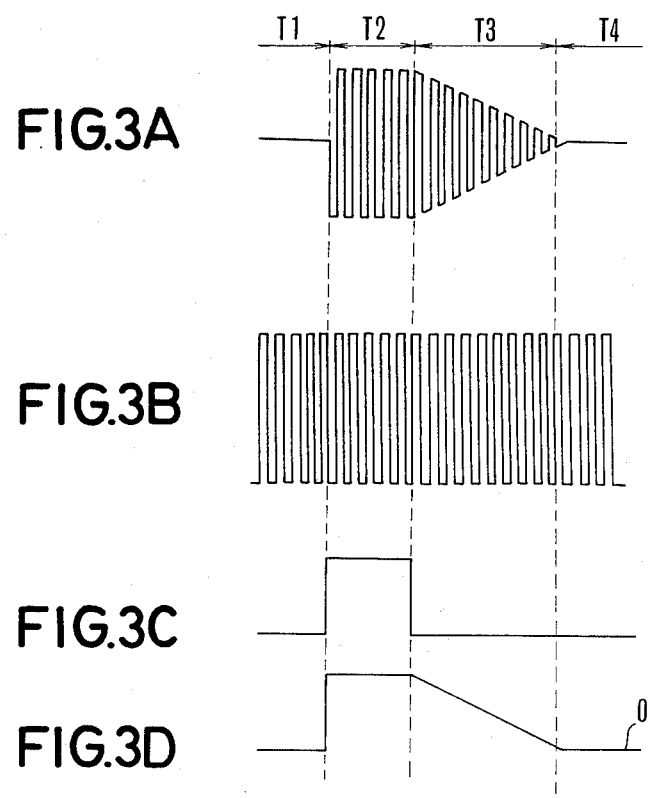
Figure 4:
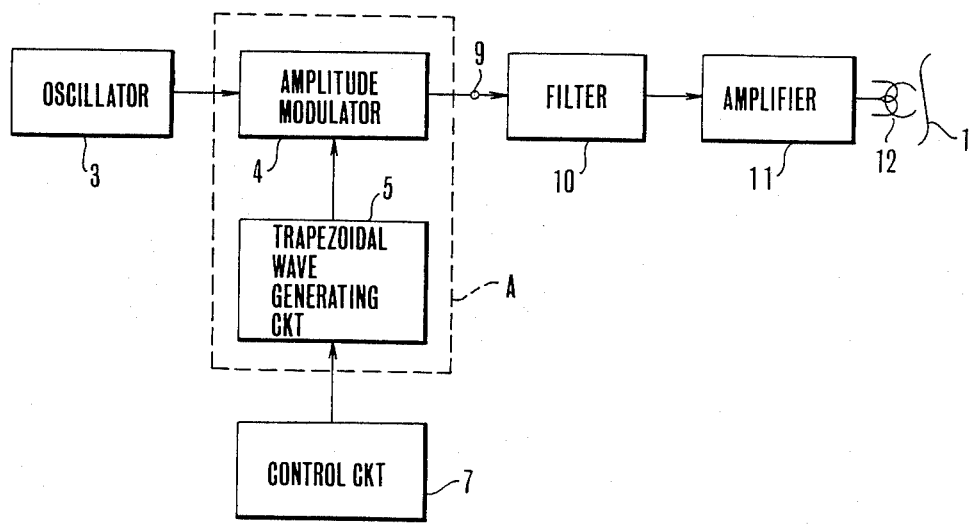
FIG. 4 is a block diagram showing an erasing signal generating device according to a prior art.
Figure 5:
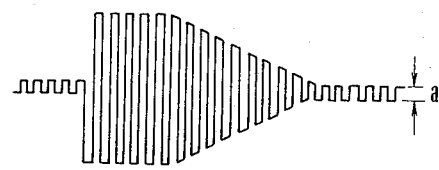
FIG. 5 is a wave-form diagram showing the state where continuous oscillation remains in an erasing signal generated by the device according to the prior art.

FIG. 1 shows an embodiment of the amplitude limiter circuit according to the present invention, which is to be included into the part indicated by the broken line A in FIG. 4. The circuit includes first and second semiconductors of different conductivity types, which are formed by npn transistor and pnp transistor 21 and 22, having emitters connected with each other. To the emitters continuous oscillation as shown in FIG. 3B is fed through a common resistor R1, which forms a third impedance element. The continuous oscillation has an amplitude larger than $2V_{BE}$, where $V_{BE}$ indicates a voltage drop across base-emitter circuit of the transistor 21 or 22. The npn transistor 21 has a base, to which is connected a parallel circuit including a resistor R2, which forms a first impedance element, and a capacitor C2. The pnp transistor 22 has a base, to which is connected a parallel circuit including a resistor R3, which forms a second impedance element, and a capacitor C3.

A capacitor C1 and an n-channel FET 23, which forms a switch element, are connected between the two parallel circuits as mentioned above. Other switching means may be used in place of the FET 23 to switch on or off the base circuits of the transistors 21 and 22. The FET 23 has a gate, to which a control signal as shown in FIG. 3C is fed through a resistor R6 and a diode 24. The gate of the FET 23 is connected through a resistor R4 to a voltage source Vcc and through a resistor R5 to a reference potential (for example, a zero potential). A signal appearing at an output terminal 9 is fed through the filter 10 and the amplifier 11 to the magnetic head 12 as an erasing signal in the same manner as shown in FIG. 4.

In the embodiment as described above, the record signal to be erased is not limited to an image signal and may include a data signal or an other information signal.

(Function of the embodiment of the amplitude limiter circuit according to the present invention) (FIGS. 1, 3A-3D and 6).

During the period T1 in FIG. 3A, if R2=R3, C2=C3 and current amplifications hfe of the transistors 21 and 22 are equal to each other, the impedance of the emitter of the transistor 21 is $$(R2 \| C2)/\{2\times(hfe+1)\}$$

where (R2 ‖ C2) is a parallel impedance of the resistor R2 and the capacitor C2, and it is substantially smaller than the impedance of the resistor R1. Accordingly, during the period T1, the continuous oscillation fed from the oscillator 3 does not appear at the output terminal 9. At this time, the emitter of the transistors 21 and 22 are at the potential of ($\frac{1}{2}$)Vcc and the bases of the transistors 21 and 22 are at the potentials of ($\frac{1}{2}$)Vcc+$V_{BE}$ and ($\frac{1}{2}$)Vcc−$V_{BE}$, respectively, where $V_{BE}$ is a voltage drop across the base-emitter circuit of the transistor 21 and −$V_{BE}$ is a voltage drop across the base-emitter circuit of the transistor 22.

During the period T2, the pulse fed from the control circuit 7 is at high level, so that the diode 24 is turned off. If R4=R5, the gate potential of FET 23 is ($\frac{1}{2}$)Vcc and the bases of the transistors 21 and 22 are short-circuited by the source-drain circuit of the FET 23. Accordingly, during the period T2, the bases of the transistors 21 and 22 are at the potential of ($\frac{1}{2}$)Vcc and the continuous signal having amplitude of $2V_{BE}$ appears at the output terminal 9.

During the period T3, the pulse fed from the control circuit 7 again becomes at low level and the source-drain circuit of the FET 23 becomes turned off. However, owing to the connections of the capacitor C1, the resistor R2 and the capacitor C2, and the resistor R3 and the capacitor C3 as described above, the potentials of the bases of the transistors 21 and 22 do not immediately become ($\frac{1}{2}$)Vcc+$V_{BE}$ and ($\frac{1}{2}$)Vcc−$V_{BE}$, respectively, and they gradually rise and fall, respectively. Thus, during the period T3, the signal having gradually decreasing amplitude appears at the output terminal 9 until the base potentials of the transistors 21 and 23 become ($\frac{1}{2}$)Vcc+$V_{BE}$ and ($\frac{1}{2}$)Vcc−$V_{BE}$, respectively. At the time when the base potentials of the transistors 21 and 22 become the potentials as described above, respectively, the output signal at the terminal 9 becomes zero and the period T4 starts.

The period T3, if the capacities of the capacitors C2 and C3 are selected to be substantially smaller than the capacity of the capacitance C1, is proportional to the product of the resistor 2 and the capacitor C1. If R2=R3, the balance between decreases of upper and lower amplitudes at the period T3 is assured (in this case it is not always necessary that the condition C2=C3 be satisfied). Accordingly, in the circuit as shown in FIG. 1, the amplitude of the damped oscillation as shown in FIG. 3A finally bcomes zero and an erasing signal having upper and lower amplitudes held in symmetric form with regard to zero line is obtained.

Figure 6:
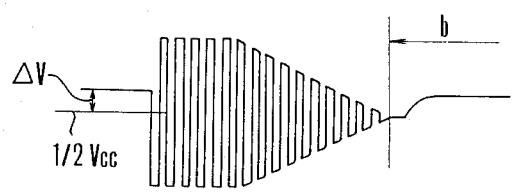
FIG. 6 is a wave-form diagram illustrating an output signal generated when current amplifications of two transistors in the circuit shown in FIG. 1 are not equal to each other.

When the current amplification hfe of the transistor 21 is not equal to that of the transistor 22, the emitter potential of the transistor 21 during the period T1 is not ($\frac{1}{2}$)Vcc and an offset of ΔV as shown in FIG. 6 may occur. In such case, an undulation at low frequency as shown by b in FIG. 6 may be produced. In order to prevent the effect of such undulation, it is possible to provide the bypass filter and the amplifier 11 with characteristic that prohibits the passing of such low frequency undulation. It is, therefore, possible to feed an erasing signal having amplitude, which finally decreases to zero, as shown in FIG. 3A, to the magnetic head.

As explained above, the present invention provides a circuit having simple construction which can generate a signal including continuous oscillation and damped oscillation following said continuous oscillation, said damped oscillation gradually decreasing its amplitude finally to zero. Furthermore the above circuit can generate such a signal, without requiring any adjustment.

What is claimed is:

1. An amplitude limiter circuit comprising:

(a) first and second transistors of different conductivity types, having their emitters connected with each other;
(b) a power source connected to the collectors of said first and second transistors;
(c) an oscillator connected to said emitters through a predetermined impedance;
(d) an output line connected to said emitters;
(e) a switch means for selectively causing the base potential of said first and second transistors to be equal to the emitter potential; and
(f) a bias means for gradually changing, after the completion of the operation of said switch means, the base potentials of said first and second transistors from the emitter potential toward ON-voltage.

2. An amplitude limiter circuit according to claim 1, werein said power source has ground potential connected to one of the collectors of said first and second transistors.

3. An amplitude limiter circuit according to claim 1, further comprising an electro-magnetic transducer element connected to said output line through a recording amplifier.

4. An amplitude limiter circuit according to claim 3, wherein said electro-magnetic transducer element is arranged in confronting relation to a magnetic recording medium.

5. An amplitude limiter circuit according to claim 1, wherein said bias means includes a time constant circuit consisting of a combination of a capacitor and resistor.

6. An erasing signal generating apparatus, comprising:
  (a) an oscillator;
  (b) a first impedance element connected to an output of said oscillator;
  (c) a second impedance element connected, in series, with said first impedance element, said second impedance element including:
    (i) a first transistor of first conductivity type having an emitter connected to said first impedance element,
    (ii) a second transistor of second conductivity type having an emitter connected to said first impedance element,
    (iii) a switch means for turning off said first and second transistors, and
    (iv) a bias means for applying bias to cause said first and second transistors to gradually turn on after the completion of such operation of said switch means in turning off said first and second transistors, and
  (d) an erasing head connected to the junction of said first and second impedance elements through a recording amplifier.

7. An erasing signal generating apparatus according to claim 6, wherein the erasing head includes an electromagnetic transducer element.

8. An erasing signal generating apparatus according to claim 6, comprising a power source for applying a predetermined potential to collectors of said first and second transistors.

9. An erasing signal generating apparatus according to claim 6 wherein said bias means includes a time constant circuit.

10. An erasing signal generating apparatus according to claim 6, in which said bias means controls the base potential of said first and second transistors.

11. An erasing signal generating apparatus according to claim 6, wherein said switch means is arranged to cause the base potentials of said first and second transistors to be equal to the emitter potentials thereof.

12. An erasing signal generating apparatus according to claim 6 wherein said first and second transistors have equal current amplification degree.

13. An erasing signal generating apparatus according to claim 6, further comprising a bypass filter connected between the erasing head and the junction of the impedance elements of said first and second transistors.

* * * * *